(12) United States Patent
Alpini

(10) Patent No.: US 6,661,120 B1
(45) Date of Patent: Dec. 9, 2003

(54) ARTICLE FOR DEFLECTING ELECTROMAGNETIC FIELDS

(76) Inventor: Edilio Livio Alpini, Via G. Gavotti, 1, 27050 Pancarana (IT)

( * ) Notice: Subject to any disclaimer, the term of this patent is extended or adjusted under 35 U.S.C. 154(b) by 0 days.

(21) Appl. No.: 09/979,703

(22) PCT Filed: May 19, 2000

(86) PCT No.: PCT/IB00/00873
§ 371 (c)(1),
(2), (4) Date: Nov. 27, 2001

(87) PCT Pub. No.: WO00/74461
PCT Pub. Date: Dec. 7, 2000

(30) Foreign Application Priority Data

May 27, 1999 (IT) .......................... MI99A1176

(51) Int. Cl.⁷ ................................. G01F 3/02
(52) U.S. Cl. .................. 307/91; 250/516.1; 250/519.1
(58) Field of Search .................. 307/91; 250/516.1, 250/519.1; 442/132

(56) References Cited

U.S. PATENT DOCUMENTS 5,115,140 A  *  5/1992  Rodriguez ............... 250/516.1
5,968,854 A  * 10/1999  Akopian et al. ............ 442/132
6,155,084 A  * 12/2000  Andrews et al. ............... 66/174

FOREIGN PATENT DOCUMENTS

| | | |
|---|---|---|
| DE | 32 070 14 A1 | 9/1983 |
| DE | 196 33 315 A1 | 2/1998 |
| EP | 0 880 311 A1 | 11/1998 |
| JP | 08 116197 | 5/1996 |
| JP | 10 226908 | 8/1998 |
| WO | WO 96/37647 A1 | 11/1996 |
| WO | WO 99/27807 A1 | 6/1999 |

* cited by examiner

Primary Examiner—Gregory J. Toatley, Jr.
(74) Attorney, Agent, or Firm—Christensen O'Connor Johnson Kindness PLLC

(57) ABSTRACT

An article for deflecting electromagntic fields consisting of a conductive meshed dry frbric with conductive filaments parallel to one another, bordered by a conductive fabric having a grid of filments arranged in criss-cross fashion. Connected to the fabric is an electric circuit designed to dissapate, by the Joule effect, the electromagnetic signal coming from the article.

11 Claims, 8 Drawing Sheets

ARTICLE FOR DEFLECTING ELECTROMAGNETIC FIELDS

CROSS-REFERENCES TO RELATED APPLICATIONS

This application claims the benefit under 35 U.S.C. §120 of International Application No. PCT/IB00/00873, filed May 19, 2000, which further claims the benefit under 35 U.S.C. §365(c) of Italian Application No. MI99A 001176, filed May 27, 1999.

BACKGROUND OF THE INVENTION

The subject of the present invention is an article capable of deflecting electromagnetic fields coming from external sources. In particular, it refers to a fabric which, associated to an electronic circuit, is able to suppress and deflect electromagnetic fields in the surrounding environment This type of fabric, associated to the electronic circuit, is particularly suitable for the production of articles commonly used in the domestic sphere, such as blankets for beds, tablecloths, carpets and curtains, as well as fabric for upholstery and furnishings, such as for picture frames, sofas, armchairs, and the like.

The need to produce this type of fabric has arisen recently precisely because the amount of electromagnetic waves to which the human body is subjected has increased considerably.

In the domestic sphere we are continuously bombarded by electromagnetic fields coming from radio transmitters and receivers, which spread electromagnetic waves in the radio-frequency range, from liquid-crystal displays of various kinds of electronic equipment, and above all from the phosphors of television screens or from computer monitors which transmit electromagnetic waves at a frequency concentrated in the 16–100 kHz frequency range.

In addition, frequently houses are built near high-tension lines supplying electric power, which emit electromagnetic radiation.

Furthermore, there has recently been a marked reinforcement of the GSM network for cell telephones; as a result, the use of cellphones has spread considerably also in the household environment, and this too is a source of emission of electromagnetic waves, in the 900–1800 MHz frequency range.

Recent medical studies have demonstrated that any charge of an electric or electromagnetic nature absorbed by the human body is prejudicial to the cellular balance of the chondriome. The chondriome is a cell apparatus consisting of the complex of chondriosomes, which are corpuscles that are found in the cytoplasm of most cells in the form of grains, filaments and rods and are thought to function in physiology of the cell.

Initially, our organism reacts by compensating for the cellular imbalance in the chondriome caused by electromagnetic radiation, but in the long run this imbalance is no longer compensated for, and this causes poor cell physiology with consequent harmful effects on human health.

The patent application MI97A 0026384 filed by the present applicant, as yet not published, describes a garment for deflecting electromagnetic fields, which has the purpose of protecting the user from the electromagnetic fields surrounding him. The above application, however, is limited only to a garment that can be worn by the user.

SUMMARY OF THE INVENTION

The purpose of the invention is to overcome such drawbacks by providing an article which is easy to make and is able to deflect and absorb the electromagnetic fields present in an environment.

This purpose is achieved, in accordance with the invention, by means of an article having the characteristics listed in the annexed independent claim 1.

Preferred embodiments of the invention appear from the dependent claims.

After repeated tests, the inventor has found that the fabric used for the garment of the patent application MI97A 0026384, connected to an appropriate electronic circuit, could be used for the production of articles of everyday household use for the suppression, deflection, absorption and abatement of the electromagnetic fields present in an environment. Consequently, it was possible to obtain a purification of the premises in which the above tests were conducted.

The article according to the invention is obtained by means of a meshed conductive fabric connected to an electronic circuit. Said conductive fabric absorbs electromagnetic fields and conveys them towards the electronic circuit, where they are dissipated by the Joule effect. The article can act as a sort of Faraday cage by discharging the electromagnetic signal to earth. Clearly, the earth is to be understood as a virtual earth, since earthing of the circuit is achieved by means of its connection to a strip made of conductive material, functioning as a dissipator.

As electronic circuit any parallel resonator may be used.

A detector of electromagnetic fields may be connected to the electronic circuit, which signals, by means of a LED, the presence of electromagnetic fields in the environment. In this way, the user knows when the article according to the invention is absorbing and deflecting an electromagnetic field.

Further characteristics of the invention will emerge more clearly from the ensuing detailed description, which refers to embodiments given purely to provide non-limiting examples, illustrated in the attached drawings, in which:

Figure 1:
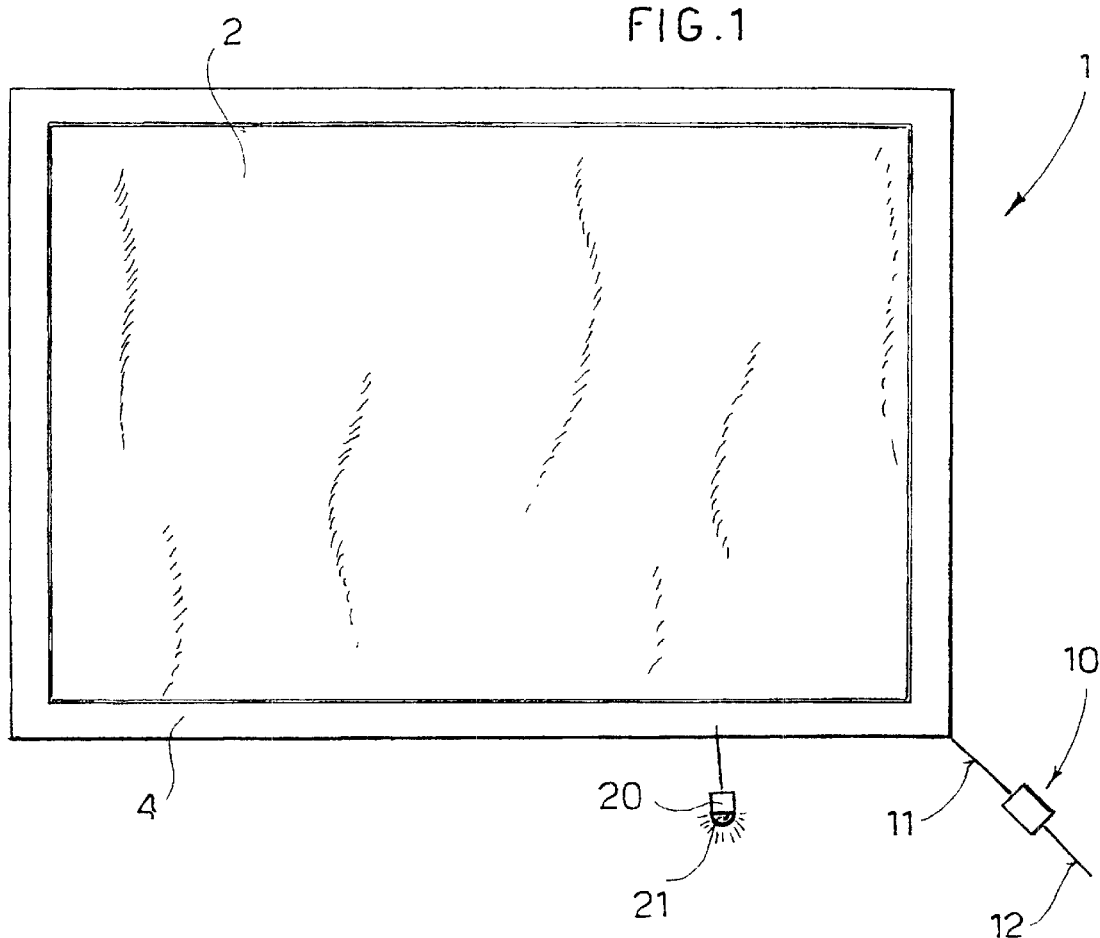
FIG. 1 shows a plan view of a blanket according to the invention.

The article according to the invention will now be described with the aid of the above figures.

DETAILED DESCRIPTION OF THE INVENTION

Purely to provide an example, reference is made to a blanket 1 that deflects electromagnetic fields, the blanket 1 consisting of a conductive, meshed, dry fabric 2. Interwoven in the weft of said fabric 2 are parallel filaments 3 made of conductive material, which preferably may be tungsten and carbon. Said filaments 3 are able to conduct the electromagnetic fields that concentrate on the blanket 1.

The perimeter of the blanket 1 is bordered by a fabric 4 with a criss-cross grid. The fabric 4 has a criss-cross grid of filaments 5, and these filaments 5 must be made of conductive material, preferably tungsten and carbon. The meshed fabric 4 is arranged on the border of the blanket 1 and is folded back, the said meshed fabric 4 having a weft that is thicker and more closely knit than the fabric 2 and having the function of closing the conductive circuit created in the blanket 1.

In the area of said border, the blanket 1 may be covered with a material which may even not be conductive; purely as an example, wool can be used as material for covering the border.

An electronic circuit 10 is connected by means of a conductor wire 11 to the fabric 4 bordering the blanket 1. Earthing of the circuit is obtained by means of a strip 12 made of conductive material, preferably copper. The strip 12 hangs from the blanket 1, so as to be able to discharge the electromagnetic field present on the blanket. The circuit 10 can be positioned in a special housing made inside the blanket 1 so as not to be visible.

Also connected to the border 4 of the blanket there is provided a detector 20 of electromagnetic fields. The detector 20 may be a solid-state detector of the type readily available commercially. The detector 20 is connected to a light source 21, for instance a LED, for emitting a light signal when the blanket 1 is absorbing an electromagnetic field. Instead of the LED 1 it is also clearly possible to provide an acoustic signalling device.

The electronic circuit 10 may be any parallel-resonator circuit with a specific cut-off frequency and frequency of resonance. Said circuit 10 must be able to dissipate, by the Joule effect, the electromagnetic signal coming from the blanket 1 and must be able to cut off the signals above its own cut-off frequency.

Figure 4:
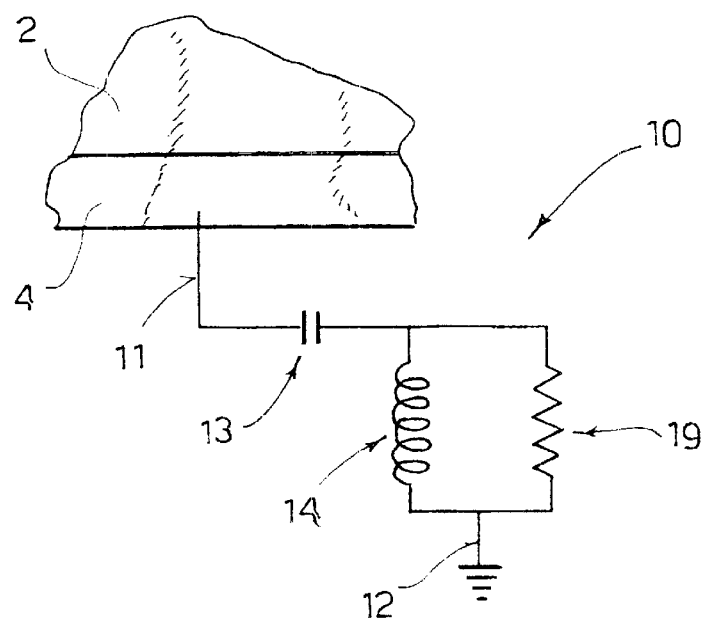
FIG. 4 shows the electric diagram of an electronic circuit according to the invention.
Figure 2:
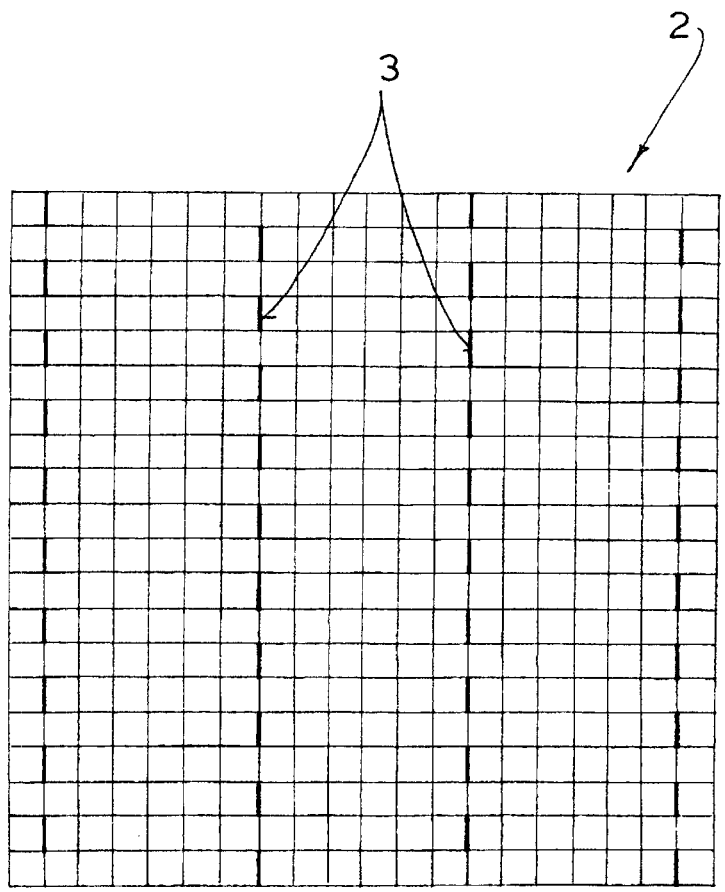
FIG. 2 shows a plan view of a detail of a fabric of the blanket of FIG. 1.
Figure 3:
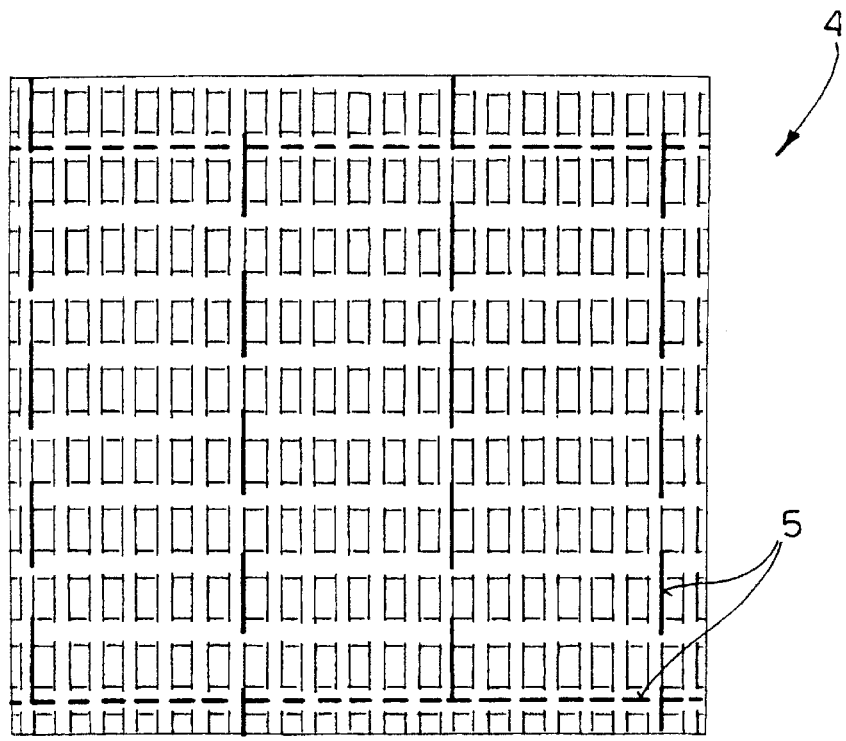
FIG. 3 shows a plan view of a detail of the weft of the border of the blanket illustrated in FIG. 1.

FIG. 4 shows a possible embodiment of the electrical diagram of the circuit 10. Between the fabric 4 of the border and the parallel-resonator circuit is set a coupling capacitor 13.

The parallel resonator is represented by the connection in parallel of an inductance coil 14 and a resistor 19.

The resistor 19 must preferably be selected with a low resistance value, approximately 100Ω, so that the power dissipated by said resistor 19 is very small, i.e., of the order of nanojoule/s. This leads to a minimal increase in temperature, quantifiable at approximately half a degree centigrade.

The coupling capacitor 13 may be selected at a capacitance value of approximately 2 pF. The inductance coil 14 of the parallel resonator may be selected at an inductance value of 10 μH.

The foregoing example of application has been provided for a blanket; it, nevertheless, remains valid also for other articles, such as curtains, carpets, tablecloths, picture frames, and fabrics for upholstery and furnishings in general.

Described below is the experiment for measuring attenuation of the electromagnetic fields acting on the article according to the invention.

Figure 5A:
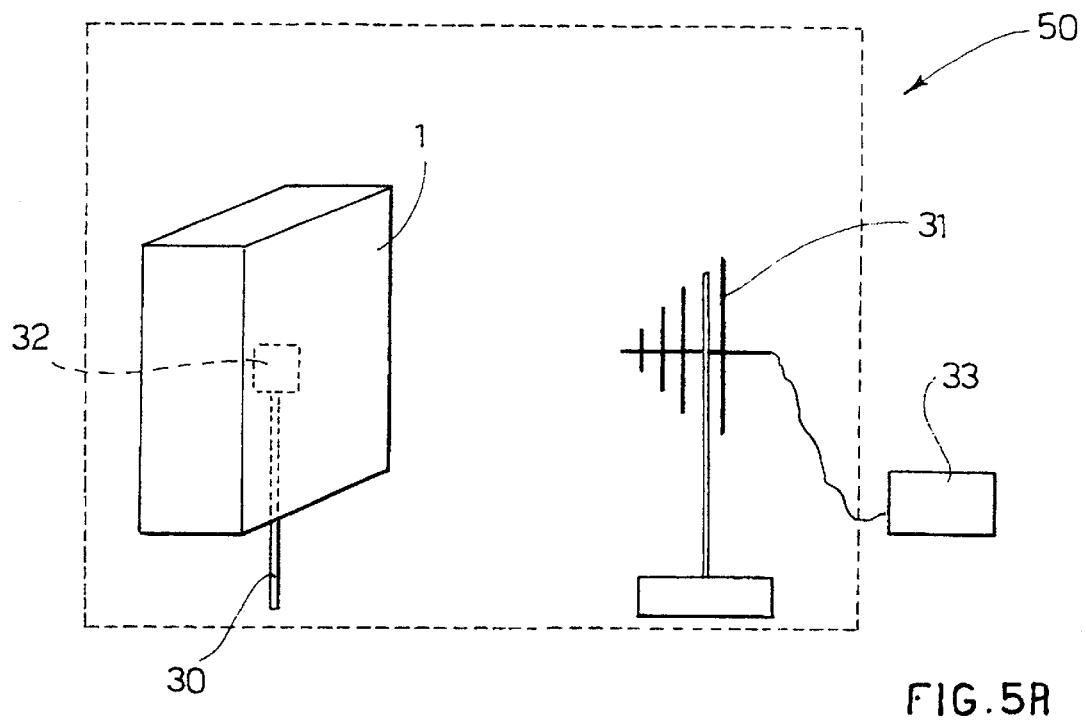
FIG. 5A shows a schematic view of an anechoic chamber for measuring attenuation of the electromagnetic field performed on the article according to the invention at a frequency in the 30–100 MHz range.

To prevent possible reflection of the electromagnetic waves, the above experiment was conducted inside an anechoic chamber 50 according to the set-up of FIG. 5A. An insulating support 30 was positioned in the anechoic chamber 50, the said support 30 being designed to support the article 1. The support 30 also supported an isotropic detector 32 designed to detect an electric field value. In the anechoic chamber 50, at a distance of one meter from the support 30, an antenna 31 was positioned to irradiate a known electromagnetic field generated by a field generator 33. The generator 33 was a generator of a programmable type generating electric fields in the radiofrequency range.

The value of percentage attenuation of the electromagnetic field was obtained applying the formula:

$$\% \text{ Att.} = (1 - (E_f/E_i)) * 100 \tag{1}$$

where $E_f$ is the final electric field value measured by the detector 32 inside the article 1, and $E_i$ is the initial value of the electric field measured by the detector 32 in the absence of the article 1.

In the 30 MHz to 1 GHz frequency range, the electric field $E_i$ detected by the isotropic probe 32 positioned in the support 30 without the article 1 was measured.

Subsequently, the electric field $E_f$ detected by the same isotropic probe 32 with the article 1 positioned on the support 30 was measured, keeping the positions of the detector 32 and the antenna 31 and the distance between them unaltered and keeping the same level of irradiated signal.

The tests were repeated with the antenna 31 set both in vertical bias and in horizontal bias; for both biases, the percentage attenuation of the article 1 both on the front side and on the rear side was ascertained.

The values of the electric fields $E_i$ and $E_f$ were measured for discrete frequencies, and applying the formula (1) the graphs of FIGS. 6–9 were obtained.

Figure 6:
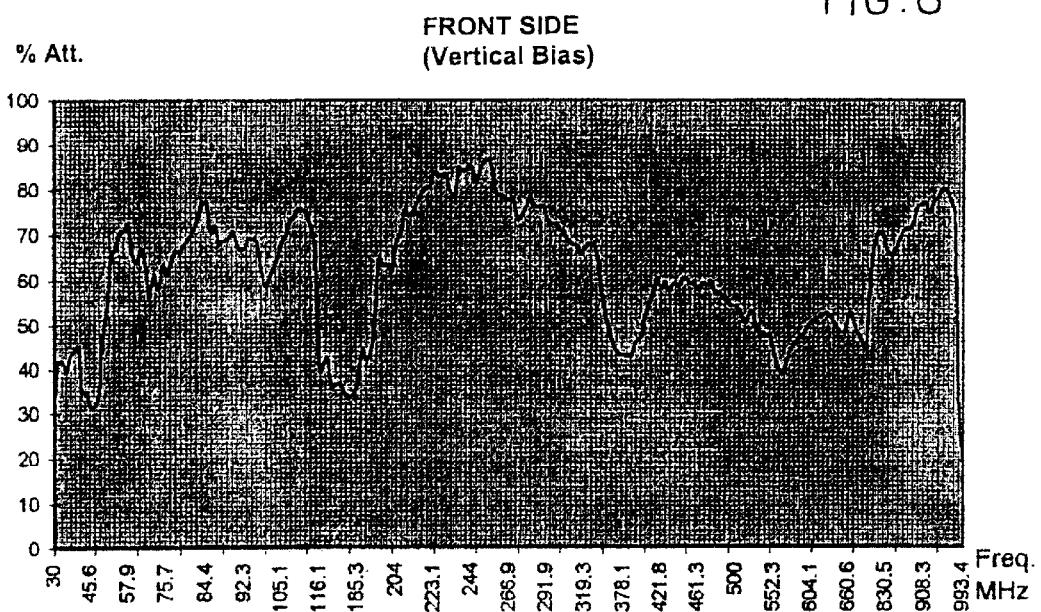
FIGS. 6–9 show diagrams of percentage attenuation of the electromagnetic field in the 30–100 MHz frequency range.
Figure 7:
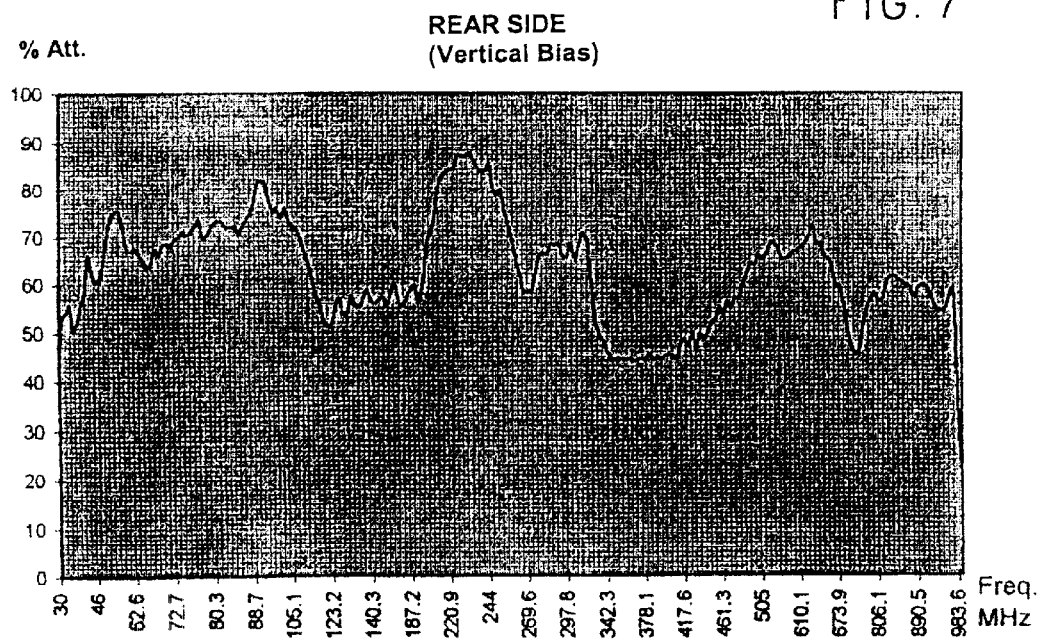

As shown in FIGS. 6 and 7, for a vertical bias, both on the front side and on the rear side of the article 1 there is a mean attenuation of approximately 65% with attenuation peaks of approximately 85% in the region of the 244 MHz frequency range.

Figure 8:
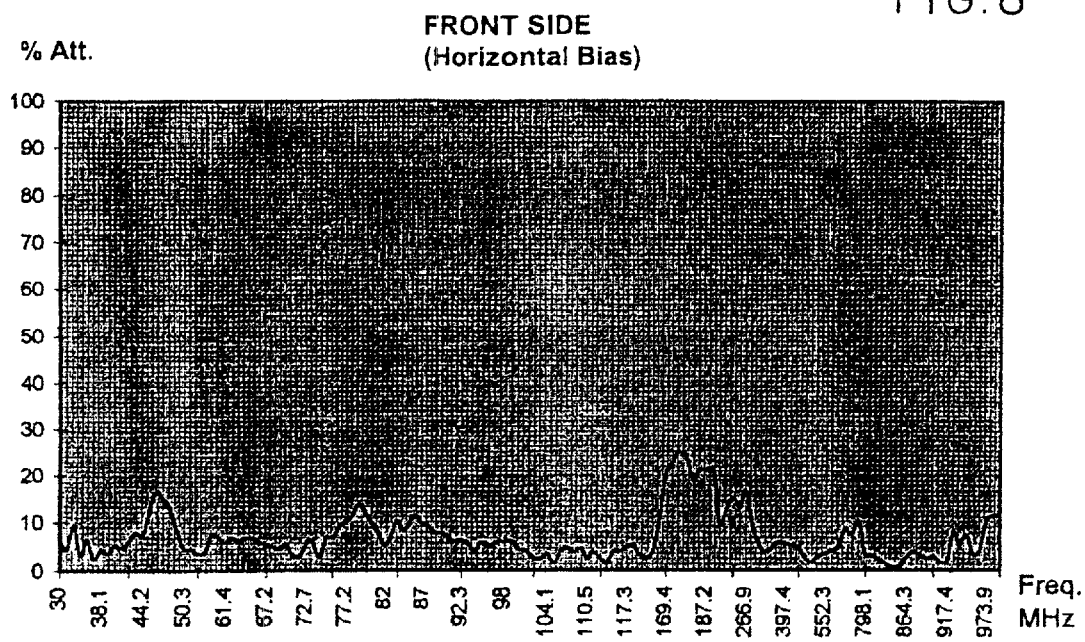
Figure 9:
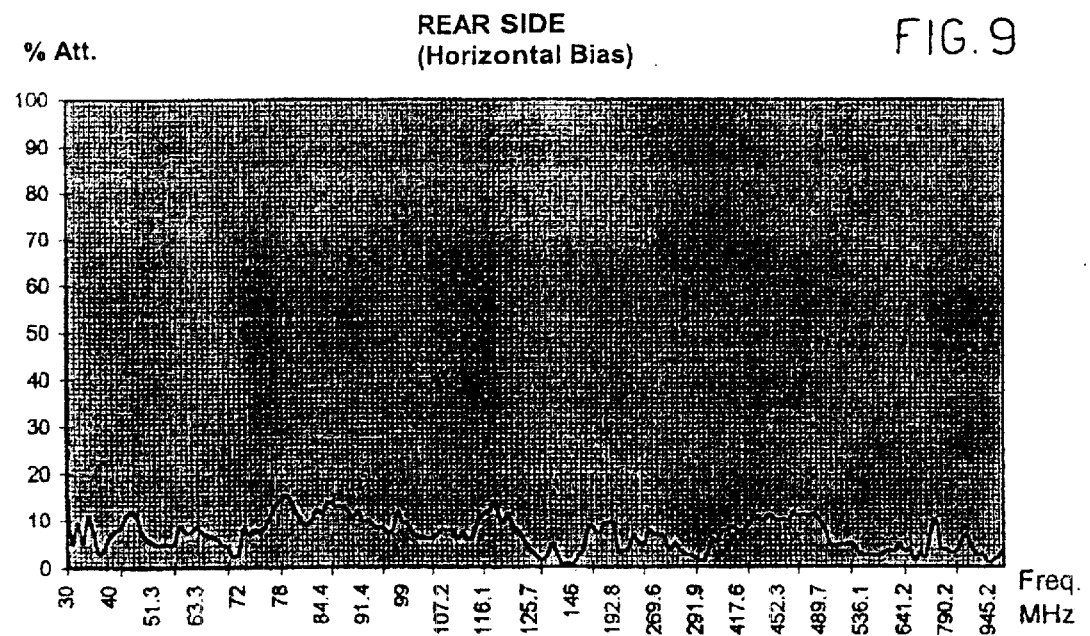

As shown in FIGS. 8 and 9, for a horizontal bias, there is an attenuation of approximately 10% both on the front side and on the rear side of the article.

Figure 5B:
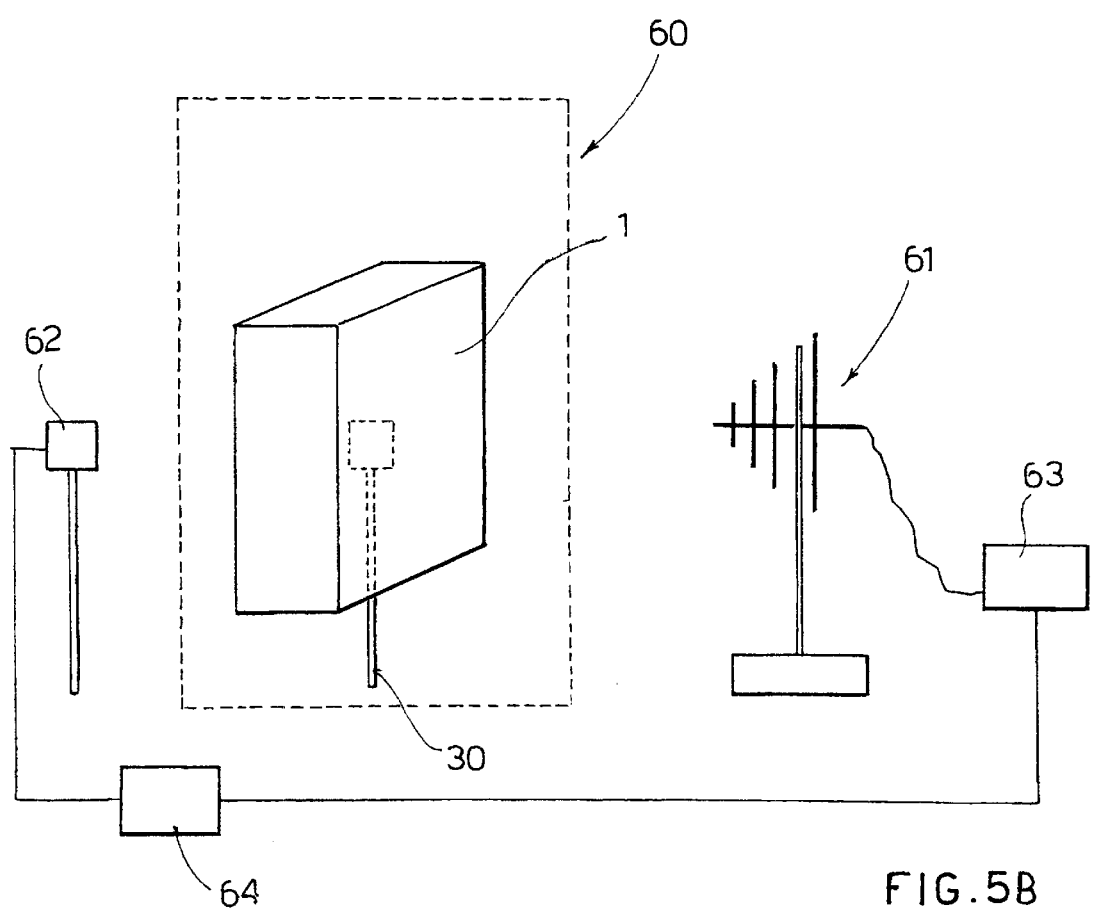
FIG. 5B shows a schematic view of a semi-anechoic chamber for measuring attenuation of the electromagnetic field performed on the article according to the invention at a frequency in the 1–2 GHz range.

To carry out tests in the 1–2 GHz frequency range, the arrangement illustrated in FIG. 5B was used. In this case two microwave antennas were used, one as transmitter 61 and the other as receiver 62, set at the same height and at a distance of one meter apart. A generator 63 of a signal in the microwave range was connected to the transmitter antenna 61 and, by means of a synchronizer 64, was synchronized with the receiver antenna 62. The measurement was performed, positioning the support 30 in a semi-anechoic chamber; instead, the receiver 62 and the transmitter 61 were positioned outside the semi-anechoic chamber.

For a vertical bias of antennas, it was possible to plot a graph of the electric field (expressed in dBμV) measured by the receiver antenna 62, in the 1–2 GHz frequency range.

Figure 10:
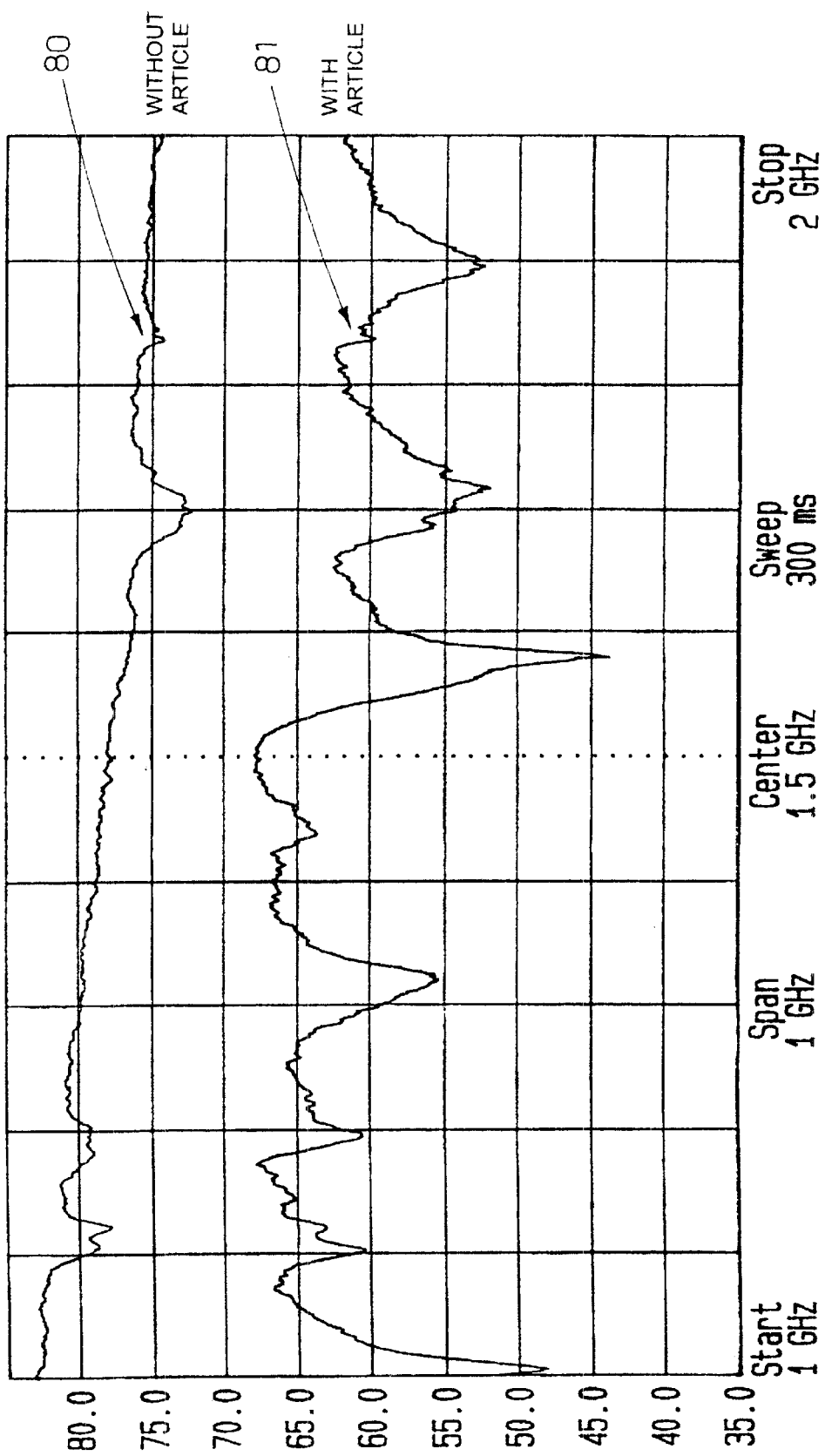
FIGS. 10 and 11 show diagrams of electromagnetic field in the 1–2 GHz frequency range.

FIG. 10 shows the plot of the electric field 80 in the absence of the article 1, and the plot of the electric field 81 attenuated on the front side of the article 1.

Figure 11:
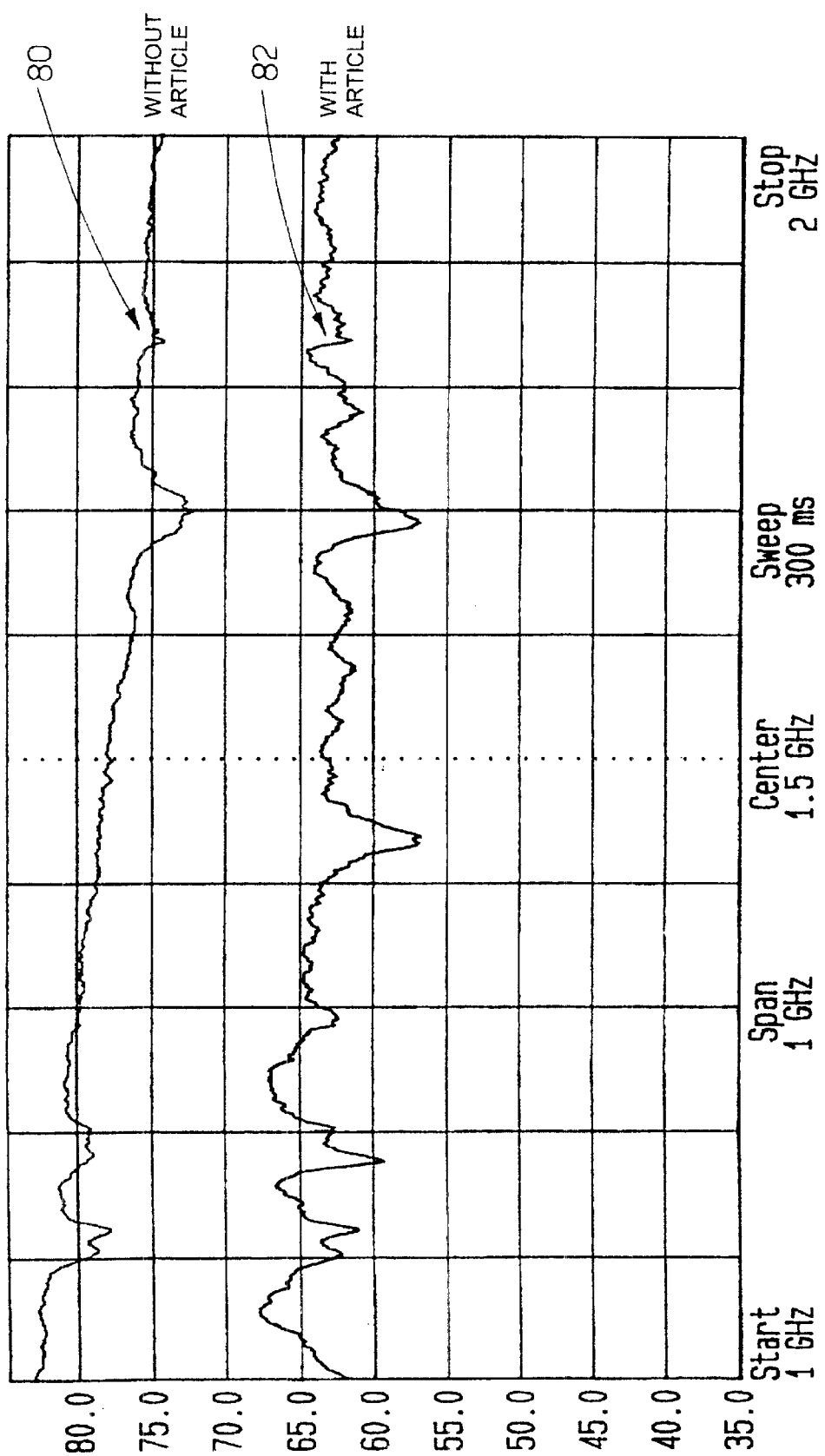

FIG. 11 shows the plot of the electric field 80 in the absence of the article 1, and the plot of the electric field 82 attenuated on the rear side of the article 1.

Figure 12:
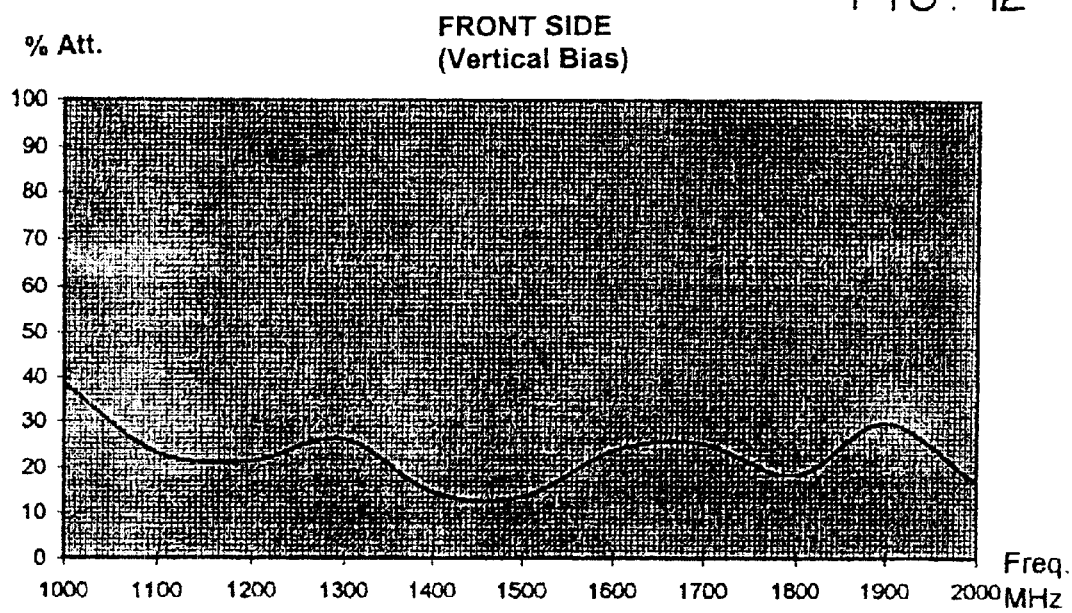
FIGS. 12 and 13 show diagrams of percentage attenuation of the electromagnetic field in the 1–2 GHz frequency range.
Figure 13:
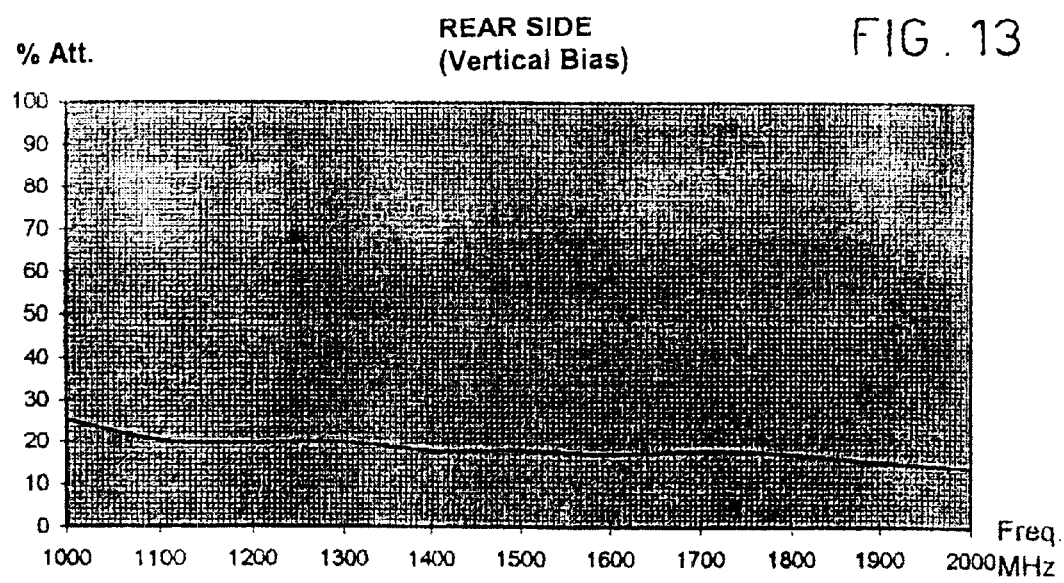

Using the values obtainable from the graphs of FIGS. 10 and 11, graphs of the percentage attenuation as a function of the frequency were obtained (shown in FIGS. 12 and 13).

From the graphs of FIGS. 12 and 13, it is possible to deduce that in the 1–2 GHz frequency range, by means of the article according to the invention there is a percentage attenuation of the electromagnetic field of approximately 20%.

What is claimed is:

1. An article for deflecting electromagnetic fields, characterized in that it comprises a conductive fabric, connected to an electronic circuit designed to dissipate, by the Joule effect, the electromagnetic signal coming from said fabric.

2. An article according to claim 1, characterized in that said conductive fabric is a meshed dry fabric with filaments consisting of conductive material, arranged parallel to one another.

3. An article according to claim 1, characterized in that said conductive bordering fabric has filaments of conductive material arranged according to a criss-cross grid.

4. An article according to claim 1, characterized in that said electronic circuit is a parallel resonator with a specific cut-off frequency and a specific frequency of resonance.

5. An article according to claim 4, characterized in that said parallel resonator consists of a connection in parallel of an inductance coil and a resistor, said parallel resonator being coupled to said conductive fabric by means of a capacitor.

6. An article according to claim 5, characterized in that the inductance of said inductance coil is approximately 10 $\mu$H, the resistance of said resistor is approximately 100Ω and the capacitance of said capacitor is approximately 2 pF.

7. An article according to claim 1, characterized in that earthing of the electronic circuit is obtained by means of a strip made of conductive material coming out of said article.

8. An article according to claim 1, characterized in that connected to said electronic circuit is a detector of electromagnetic fields operating a light source or acoustic source which indicates an absorption of electromagnetic fields by the article.

9. An article according to claim 1, characterized in that said article is a blanket.

10. An article according to claim 1, characterized in that said article is a fabric to be used as a covering for furnishings in general.

11. An article according to claim 1, wherein the conductive fabric is bordered with a closed conductive fabric.

* * * * *

UNITED STATES PATENT AND TRADEMARK OFFICE
CERTIFICATE OF CORRECTION

PATENT NO. : 6,661,120 B1
DATED : December 9, 2003
INVENTOR(S) : E.L. Alpini

Page 1 of 1

It is certified that error appears in the above-identified patent and that said Letters Patent is hereby corrected as shown below:

<u>Title page,</u>
Item [76], Inventor, "Pancarana (IT)" should read -- Pancarana, Pavia (IT) --

<u>Column 5,</u>
Line 13, reorder and renumber claims 3-11 and their dependent claims
"claim 1," should read -- claim 11, --

Signed and Sealed this

Twenty-third Day of March, 2004

JON W. DUDAS
*Acting Director of the United States Patent and Trademark Office*